United States Patent [19]
Fujisawa et al.

[11] Patent Number: 6,088,252
[45] Date of Patent: Jul. 11, 2000

[54] SEMICONDUCTOR STORAGE DEVICE WITH AN IMPROVED ARRANGEMENT OF ELECTRODES AND PERIPHERAL CIRCUITS TO IMPROVE OPERATIONAL SPEED AND INTEGRATION

[75] Inventors: Hiroki Fujisawa; Masayuki Nakamura, both of Ome, Japan

[73] Assignee: Hitachi, Ltd., Tokyo, Japan

[21] Appl. No.: 09/177,889

[22] Filed: Oct. 23, 1998

[30] Foreign Application Priority Data

Oct. 24, 1997 [JP] Japan .................................. 9-309834

[51] Int. Cl.⁷ ...................................................... G11C 5/02
[52] U.S. Cl. ........................... 365/51; 365/230.03; 365/63
[58] Field of Search ................... 365/230.03, 51, 365/63

[56] References Cited

U.S. PATENT DOCUMENTS 5,862,095  1/1999  Takahashi et al. ................. 365/230.03
5,901,105  5/1999  Ong et al. ........................... 365/230.03
5,926,431  7/1999  Toda ................................... 365/230.03

FOREIGN PATENT DOCUMENTS 5-343634  12/1993  Japan .

*Primary Examiner*—Richard Elms
*Assistant Examiner*—Van Thu Nguyen
*Attorney, Agent, or Firm*—Antonelli, Terry, Stout & Kraus, LLP

[57] ABSTRACT

A semiconductor storage device is provided in which electrodes are provided so as to be arranged in the central portion so as to divide a semiconductor chip into two segments, an address buffer is provided neighboring those electrodes which receive address signals among said electrodes, memory arrays are constituted so as to be divided into at least two groups sandwiching said central portion, an address decoder is provided on a peripheral side of the semiconductor chip opposite to the central portion where the electrodes of the semiconductor chip are formed, and a predecoder for decoding the address signals is arranged on an intermediate portion extending from said central portion to a portion where said address decoder is provided.

13 Claims, 10 Drawing Sheets

SEMICONDUCTOR STORAGE DEVICE WITH AN IMPROVED ARRANGEMENT OF ELECTRODES AND PERIPHERAL CIRCUITS TO IMPROVE OPERATIONAL SPEED AND INTEGRATION

BACKGROUND OF THE INVENTION

The present invention relates to a semiconductor storage device and, particularly, to technology that can be effectively utilized for a semiconductor storage device designed to have a mass storage capacity such as a dynamic RAM (random access memory) using external lead terminals of, for example, LOC (Lead-On-Chip) technology.

Peripheral circuits are arranged on a semiconductor memory having a LOC (Lead-On-Chip) structure generally by arranging the bonding pads along the central portion in the lengthwise direction of the chip, and arranging address buffers and address decoders to correspond to input signals such as address signals that are input through the bonding pads. Such a semiconductor memory has been disclosed in Japanese Patent Laid-Open No. 5-343634.

SUMMARY OF THE INVENTION

The size of a semiconductor chip increases with an increase in the memory capacity, and the signal transmission passages seriously affect the operation speed. In the above-mentioned conventional semiconductor memory, attention has been given to only signal transmission passages that focus on input signals received through the bonding pads. When broader consideration is given to the operation for selecting addresses for reading or writing stored data and the flow of signals between the selected memory cells and the external terminals, however, the present inventors have discovered the fact that minimizing the signal transmission passages with emphasis on the input signals received through the bonding pads does not necessarily contribute to an increase in the speed of the memory. In particular, when it is considered that a defect relief circuit becomes essential as a result of an increase in the size of the semiconductor chip and that the circuit must be switched to a spare circuit upon detection of a defective address and depending upon the result of detection, it became obvious through the study by the present inventors that the conventional method of arranging the peripheral circuits raises a problem of extended passages for the routing of signals.

In the address selection operation, furthermore, an address signal has a binary weight. When the address signals are predecoded, therefore, the number of the predecoded output signals inevitably increases relative to the input signals. When a predecoding circuit is provided near the address buffer in a manner as described above, therefore, a number of wirings are concentrated at the central portion of the semiconductor chip, thereby to deteriorate the degree of integration.

An object of the present invention is to provide a semiconductor storage device which has been increased memory capacity and an increased operation speed.

Another object of the present invention is to provide a semiconductor storage device in which a high degree of integration of the circuits is realized.

The above and other objects as well as various novel features of the present invention will become more apparent from the description provided in the specification and the accompanying drawings.

Briefly described below is a representative example of the invention disclosed in this application. That is, a semiconductor storage device in which electrodes are arranged in the central portion so as to divide, into two segments, a semiconductor chip that is to be connected to external lead terminals, an address buffer is provided neighboring those electrodes which receive address signals among said electrodes, a plurality of memory cells are arranged in the form of a matrix at points where a plurality of word lines intersect a plurality of bit lines, thereby to constitute memory arrays that are divided into at least two groups sandwiching the central portion of the chip where said plurality of electrodes are formed, an address decoder for selecting said word lines or said bit lines is provided on a peripheral side of the semiconductor chip opposite to the central portion where the electrodes of the semiconductor chip are formed, and a predecoder for decoding the address signals is arranged in an intermediate portion extending from said central portion to a portion where said address decoder is provided.

DETAILED DESCRIPTION OF THE INVENTION

Figure 1:
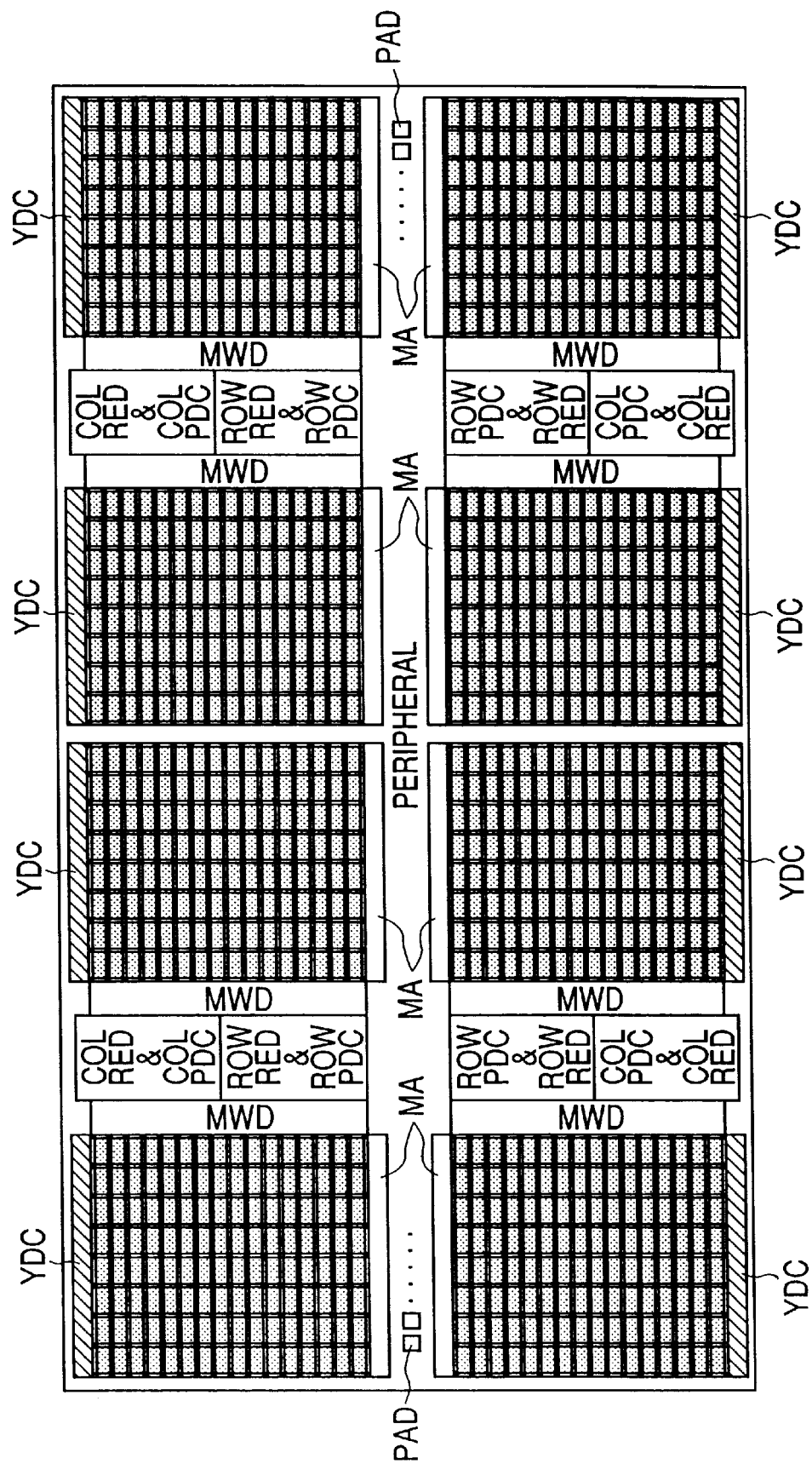
FIG. 1 is a diagram schematically illustrating the layout of a dynamic RAM according to an embodiment of the present invention.

FIG. 1 is a diagram schematically illustrating the layout of a dynamic RAM according to an embodiment of the present invention Among the circuit blocks constituting the dynamic RAM, FIG. 1 illustrates a portion related to the present invention in a simplified manner, the portion being formed on a single semiconductor substrate such as of single crystalline silicon relying upon a known technology for producing semiconductor integrated circuits.

Though there is no particular limitation in this embodiment, the memory array as a whole is divided into eight sections. Four memory arrays are arranged on the upper side and on the lower side, respectively, along the lengthwise direction of the semiconductor chip, two memory arrays are arranged on the right side and on the left side, and on the central portion along the lengthwise direction of the chip there is formed an input/output interface (peripheral) circuit constituted by an address input circuit, a data input/output circuit and sequences of bonding pads. Main amplifiers are arranged on the center sides of the memory arrays.

In the total of eight memory arrays, consisting four memory arrays or two memory arrays on the upper side and two memory arrays on the lower side along the lengthwise direction of the semiconductor chip, and two memory arrays on both the right and left sides, there are arranged X-system predecoder circuits ROWPDC and relief circuits ROWRED, as well as Y-system predecoder circuits COLPDC and relief circuits COLRED in the intermediate portions in the right-and-left direction, which is the lengthwise direction. Main word driver regions MWD are formed along the intermediate portions of the memory arrays in order to drive main word lines that are extending toward the upper and lower sides relative to the memory arrays.

In the memory arrays, the Y-decoders YDC are provided on the peripheral side of the chip opposite to the central portion of the chip. That is, in this embodiment, the memory arrays divided into eight sections are sandwiched by the main amplifiers MA arranged on the center side and by the Y-decoders YDC arranged on the peripheral side. As will be described later, the memory array is divided into a plurality of sub-arrays. The sub-arrays are formed so as to be surrounded by the sense amplifier regions and the sub-word driver regions that are arranged to sandwich them. The portions, where the sense amplifier regions intersect the sub-word driver regions, are crossing areas. The sense amplifiers formed on the sense amplifier region are is constituted by a shared sense system. Complementary bit lines are formed on the right and left with the sense amplifiers as a center, except for the sense amplifiers arranged at both ends of the memory cell array, and are selectively connected to the complementary bit lines of either the right or the left memory cell array.

The four memory arrays divided along the lengthwise direction of the semiconductor chip are arranged in pairs of two memory arrays. The two memory arrays arranged in a pair have, in the intermediate portion thereof, an X-system predecoder circuit ROWPDC and a relief circuit ROWRED, as well as a Y-system predecoder circuit COLPDC and a relief circuit COLRED. That is, the memory arrays are arranged up and down with the X-system predecoder circuit ROWPDC, relief circuit ROWRED, Y-system predecoder circuit COLPDC and relief circuit COLRED as centers. The main word driver MWD forms a selection signal for main word lines that extend in the lengthwise direction of the chip so as to pass through the memory arrays. The main word driver MWD is further provided with a driver for selecting sub-word lines which extend in parallel with the main word lines to form a selection signal for the sub-word selection lines as will be described later.

Though not illustrated, each sub-array is constituted by 512 sub-word lines and 512 pairs of complementary bit lines (or data lines) crossing at right angles therewith. Spare word lines and spare complementary bit lines are provided to relieve defective word lines or defective bit lines. In one memory array, 16 sub-arrays are provided in a direction in which the word lines are arranged. Therefore, the sub-word lines of about 8K are provided as a whole and eight sub-word lines are provided in a direction in which the bit lines are arranged. Therefore, about 4K complementary bit lines are provided as a whole. Since eight memory arrays are provided as a whole, the memory capacity becomes 8×8K× 4K=256 megabits. Therefore, the length of the complementary bit lines is divided into 1/16 to correspond to 16 sub-arrays. The sub-word lines are divided into a length of 1/8 to accommodate eight sub-arrays.

A sub-word driver (sub-word line drive circuit) is provided for each of the divided sub-arrays in the memory array. The sub-word driver is divided into a length of 1/8 to meet the main word lines, and forms a selection signal for the sub-word lines that extend in parallel therewith. In this embodiment, though there is no particular limitation, four sub-word lines are arranged for one main word line in the direction of the complementary bit lines in order to decrease the number of the main word lines or, in other words, in order to widen the pitch of the main word lines. A sub-word selection driver that is not shown is arranged in the main word driver MWD, in order to select a sub-word line out of the sub-word lines divided into eight lines in the direction of the main word lines, and is allocated four each in the direction of the complementary bit lines. The sub-word selection driver forms a selection signal for selecting a sub-word selection line out of the four sub-word selection lines extending in the direction in which the sub-word driver is arranged.

Figure 2:
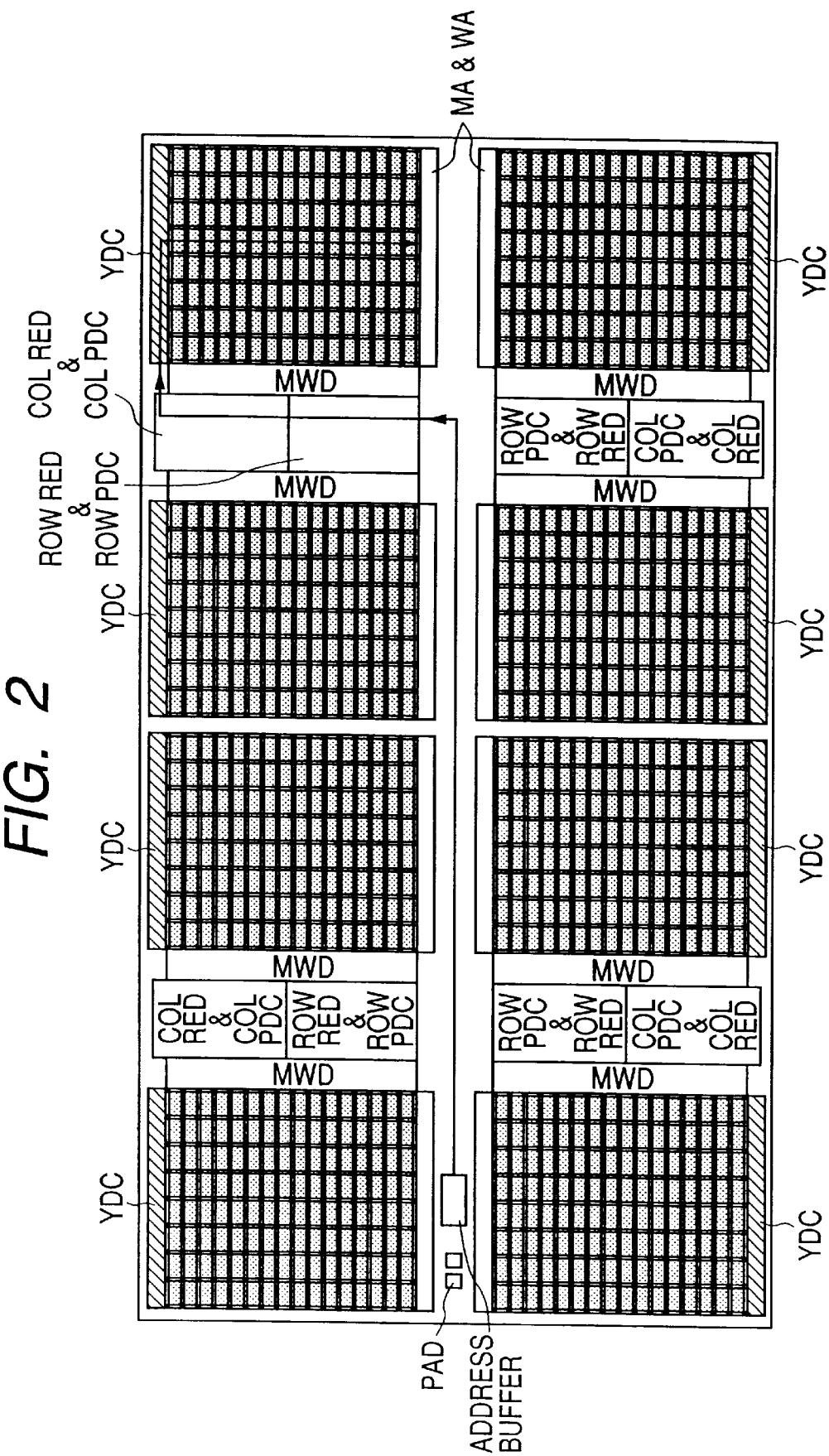
FIG. 2 is a diagram schematically illustrating the layout to explain the operation of the dynamic RAM of the present invention.

FIG. 2 is a diagram schematically illustrating the layout for explaining the operation of the dynamic RAM according to the present invention. In FIG. 2, an arrow indicates the flow of signals when the memory array on the upper side of the chip is to be read out in response to a signal from the address buffer provided on the lower side of the chip in the case where the layout of FIG. 1 is employed.

A Y-address, when input, is transmitted to the relief circuit COLRED provided in the intermediate portion of the memory arrays through the address buffer, and is transmitted to the Y-decoder YDC disposed on the peripheral side of the chip through the predecoder COLPDC and a Y-selection signal is formed there. The Y-selection signal selects a complementary bit line in the sub-arrays, and is transmitted to the main amplifier MA on the center side of the chip which is on the side opposite thereto, and is amplified and output through an output circuit that is not shown.

This constitution may so appear that the signals are routed around the chip and an extended period of time is required before a reading signal is output. However, an address signal must be directly input to the relief circuit. Therefore, upon arranging the relief circuit somewhere at the center of the chip, the output time of the predecoder is determined after having obtained the result of judging whether the address is defective or not. That is, when the predecoder is separated away from the relief circuit, a delay in the signal causes the practical Y-selection operation to be delayed. The relief circuits are arranged in a collective manner as a circuit block. Therefore, if the predecoder and the relief circuit are arranged near the memory array on the upper side in FIG. 2, signal delay is not much of a problem in the memory array.

In the memory array neighboring the address buffer, however, the address signal is supplied to the relief circuit at the end of the chip on the opposite side and to the predecoder where it is judged whether access is made to a defective address or not. The result of judgement returns through a route opposite to the above route, and the Y-selection operation is executed. When there are a plurality of memory arrays as described above, the memory cycle is determined depending upon the operation for selecting the memory array which requires the longest time for the selection operation. Therefore, the memory access time is determined by a delay of time in the above-mentioned worst case.

Referring to a signal transmission passage for reading in the memory array, furthermore, when the signals are to be read out from the complementary bit lines of a sub-array in the periphery of the chip on the opposite side according to the conventional layout in which the Y-decoder exists at the center of the chip, the time required by the Y-selection signal to traverse the memory array is added to the time required by the signal read out from a complementary bit line in the sub-array in the periphery of the chip to be transmitted to the main amplifier passing through the input/output line and traversing the memory array in a direction opposite to the Y-selection signal. That is, in the worst case, the signal makes a round trip through the memory array and is delayed.

According to the present invention, on the other hand, the main amplifier MA and the Y-decoder YDC are arranged on both sides sandwiching the memory array. Therefore, the sum of a signal transmission passage for selecting a complementary bit line of a sub-array and a signal transmission passage from the selected complementary bit line to the input of the main amplifier MA through the input/output line is just that required for traversing the memory array no matter which complementary bit line is selected and is shortened to one-half compared to that of the device that makes a round trip. This makes it possible to increase the speed of memory access.

Figure 3:
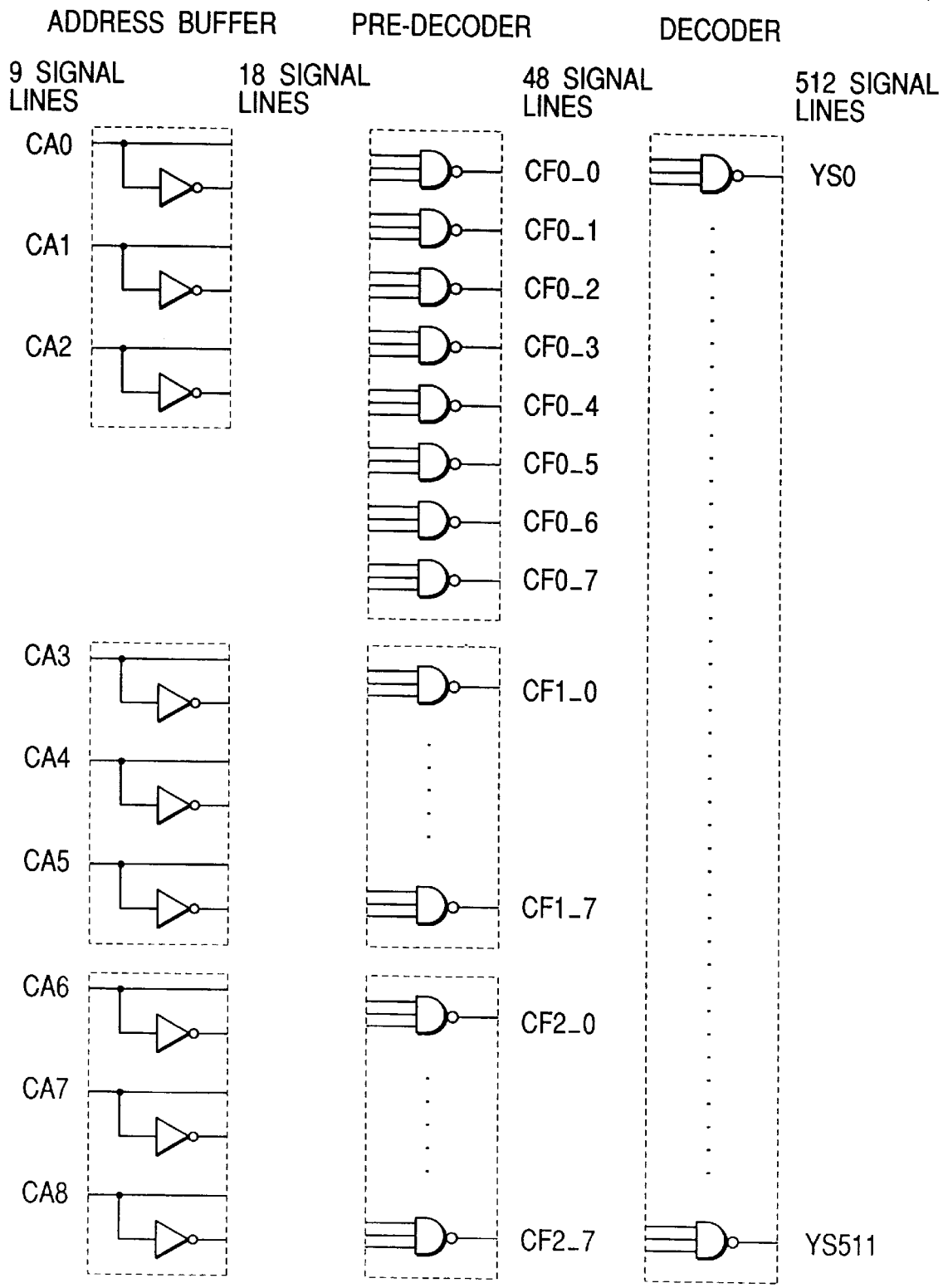
FIG. 3 is a circuit diagram schematically illustrating the address buffer of the Y-system for selecting complementary bit lines in the sub-arrays, and for explaining the predecoder and the decoder.

FIG. 3 is a schematic circuit diagram illustrating a Y-system address buffer for selecting a complementary bit line in the sub-array, a predecoder and a decoder. An address signal consists of 9 bits, CA0 to CA8. That is, the address signal fed from nine electrodes is input to nine address buffers where it is output as an internal complementary address signal in phase or in opposite phase with an address signal received from an external unit. Therefore, the number of signals output from the address buffer to the predecoder circuit becomes 18.

Though there is no particular limitation, the predecoder circuit is constituted by a three-input logic gate circuit, which classifies the 9-bit address signals into three groups each forming 8 different predecoded signals, i.e., forming 24 different predecoded output signals CF0-0 to CF0-7, CF1-0 to CF1-7, and CF2-0 to CF2-7. The decoder is constituted by a three-input logic gate circuit, and combines the above-mentioned three groups of predecoded signals to form 512 different Y-selection signals. Therefore, as many as 48 signal lines are required from the predecoder circuit to the decoder circuit, inclusive of those for in-phase signals and those for opposite-phase signals.

In a constitution where a predecoder COLPDC and a relief circuit COLRED are arranged at positions close to the Y-decoder YDC as described above, the area occupied by the signal lines can be decreased. Signal lines as relatively few as 18 in number are arranged from the address buffer ADDBUP to the predecoder circuit and, besides, the predecoder PDC and the relief circuit RED are arranged close to each other in a collective manner. As many as 48 signal lines for transmitting the predecoder outputs are allowed to be short in length since the predecoder PDEC and the decoder YDC are arranged close to each other. Besides, there is no wiring that is crossing. Therefore, the wiring layout is simplified.

That is, in the constitution in which the address buffer, predecoder and relief circuit are formed at the center of the chip, a variety of wirings exist in a mixed manner, including address signal lines from the address buffer to the relief circuit and to the predecoder circuit, lines from the predecoder circuit to the decoder circuit, and lines from the relief circuit to the decoder circuit. In other words, the wirings occupy a large area.

In a synchronous DRAM, a column address signal for the burst mode is formed by an address counter. That is, in addition to the above, the address buffer supplies an initial value to the address counter and based upon this, the address is stepped up by the increment (+1) operation of the address counter thereby to execute a burst reading operation or a burst writing operation in a burst mode. In the synchronous DRAM, therefore, the wirings become further congested, occupy further increased areas, and the operation speed decreases as the wirings are routed around.

According to this embodiment, the address counter is disposed adjacent to the address buffer even in the above-mentioned synchronous DRAM, and is connected to the predecoder circuit and to the relief circuit through a decreased number of lines, and is connected to the Y-decoder through these circuits. Therefore, the Y-selection operation and the data input/output operation are ideally combined together in the above-mentioned memory array, and the access path is shortened. According to calculations conducted by the present inventors, employment of the constitution of the present invention makes it possible to shorten the column access time by about 1 ns compared to the case where the address buffer, address counter, predecoder, relief circuit and Y-decoder are arranged at the center of the chip.

Figure 4:
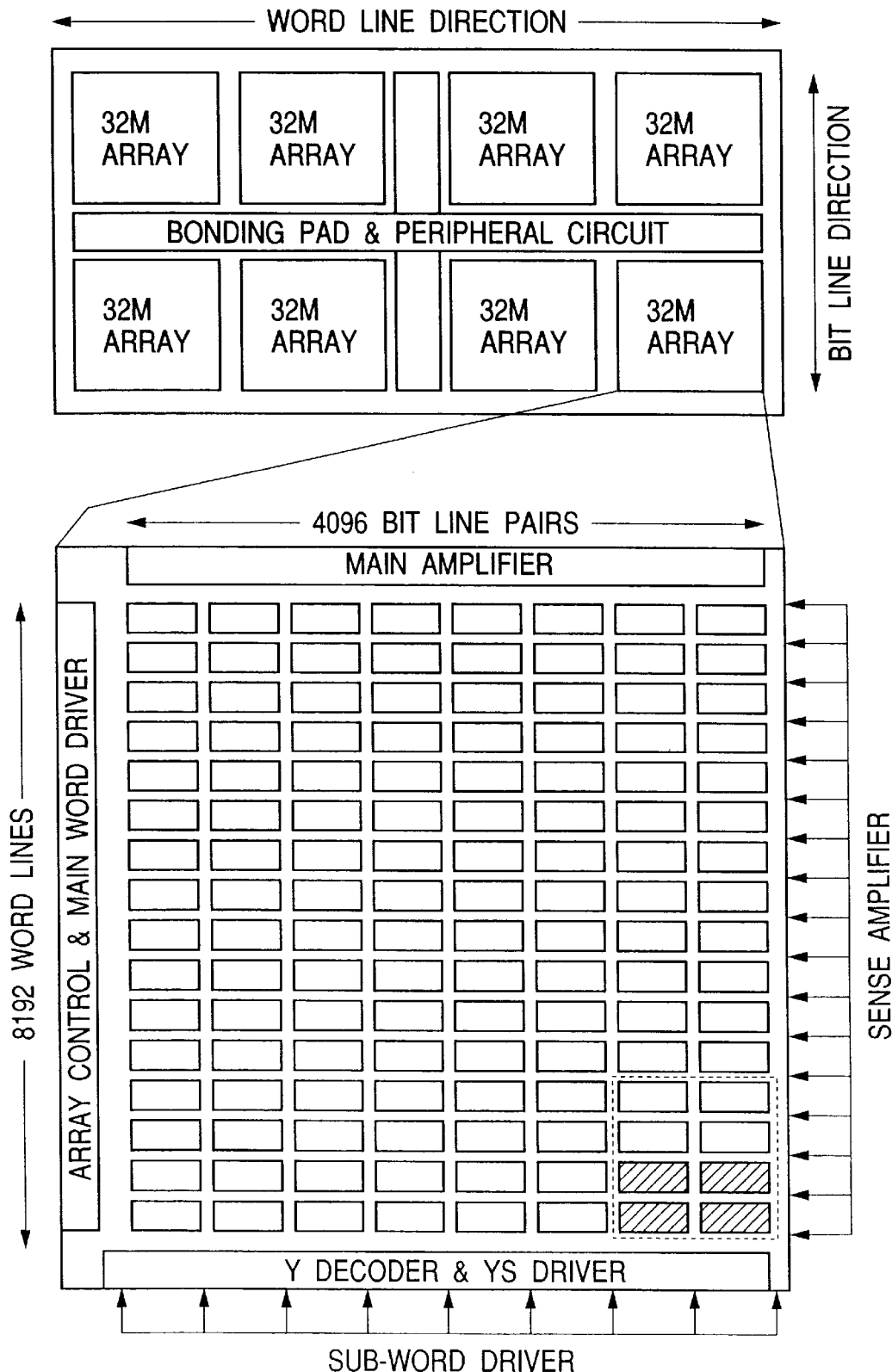
FIG. 4 is a diagram schematically illustrating the layout of the dynamic RAM of the present invention.

FIG. 4 is a diagram schematically illustrating the layout for explaining, in further detail, the dynamic RAM according to the present invention. FIG. 4 schematically illustrates the layout of the whole memory chip and the layout of one of the eight/split memory arrays. FIG. 4 illustrates the embodiment of FIG. 1 from a different point of view. That is, like FIG. 1, the memory chip is divided into eight sections, i.e., four memory arrays on the upper side and four memory arrays on the lower side along the lengthwise direction (direction of word lines), with two memory arrays on the right side and two memory arrays on the left side, and a plurality of bonding pads and peripheral circuits such as input/output circuit, etc. are provided at the central portion in the lengthwise direction.

The eight memory arrays have a memory capacity of about 32 megabits, respectively. One of them is shown on an enlarged scale; i.e., the memory array is divided into eight columns in the direction of the word lines and into sixteen rows in the direction of bit lines to constitute sub-arrays. On both sides of the sub-arrays in the direction of the bit lines there are arranged sense amplifiers in the direction of the bit lines. Sub-word drivers are arranged on both sides of the sub-arrays arrays in the direction of the word lines.

Each memory array is provided with a total of 8192 word lines and 4096 pairs of complementary bit lines. Therefore, the memory array has a memory capacity of about 32 megabits as a whole. Since 8192 word lines are arranged being divided into 16 sub-arrays, each sub-array has 512 word lines (sub-word lines). Moreover, since 4096 pairs of complementary bit lines are arranged being divided into eight sub-arrays, each sub-array has 512 pairs of complementary bit lines.

The main word driver MWD is provided to correspond to the main word lines of the memory array. That is, the array control circuit and the main word driver are provided on the left side of the memory array shown in FIG. 4. The array control circuit is provided with a driver for driving a first sub-word selection line. In the memory array are arranged main word lines extending through the eight sub-arrays. The main word driver drives the main word lines. Like the main word lines, the first sub-word selection lines extend through the eight sub-arrays. The Y-decoder and the Y-selection line driver are provided in the lower part of the array (on the peripheral side of the chip).

Figure 5:
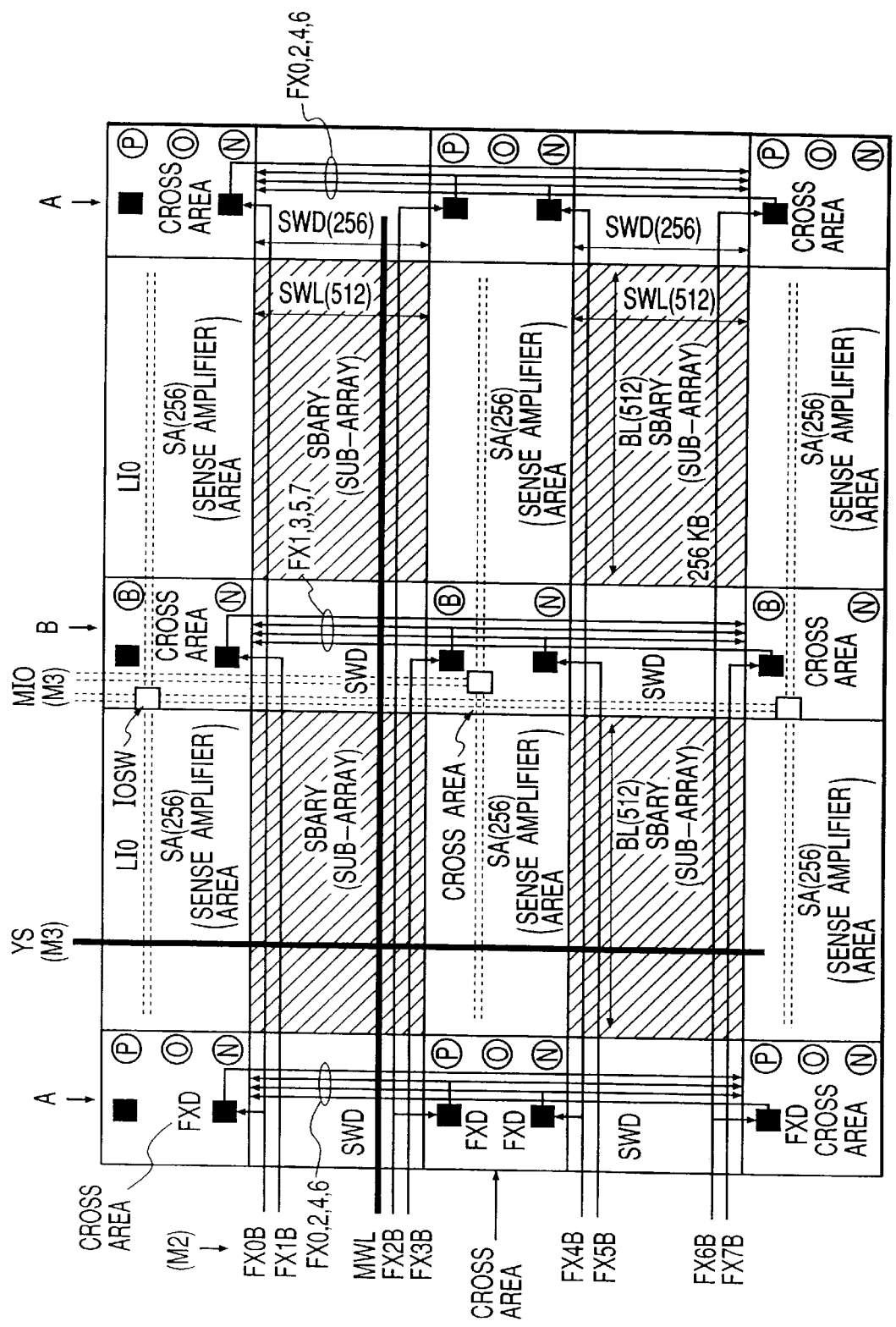
FIG. 5 is a diagram schematically illustrating the layout of sub-arrays and peripheral circuits thereof in the dynamic RAM according to an embodiment of the present invention.

FIG. 5 is a diagram schematically illustrating the layout of the sub-array and the peripheral circuits in the dynamic RAM according to an embodiment of the present invention. FIG. 5 representatively shows four sub-arrays SBARY disposed at positions hatched in the memory array of FIG. 4. In FIG. 5, the regions where the sub-arrays SBARY are formed are hatched to make a distinction from the sub-word driver region, sense amplifier region and crossing areas formed in the peripheries thereof.

When the word lines are extended in the horizontal direction, the sub-array SBARY is constituted by 512 sub-word lines SWL and 512 pairs of complementary bit lines. Therefore, 512 sub-word drivers SWD corresponding to 512 sub-word lines SWL are arranged in a manner that 256 sub-word drivers SWD are arranged on the right side of the sub-array and 256 sub-word drivers SWD are arranged on the left side of the sub-array. 512 sense amplifiers corresponding to 512 pairs of complementary bit lines BL are arranged under the shared sense amplifier system as described above, with 256 each being provided on the upper and lower sides of the sub-array.

The sub-array SBARY is provided with spare word lines that are not shown in addition to 512 regular sub-word lines SWL. Therefore, the sub-word drivers SWD corresponding to the above-mentioned 512 sub-word lines SWL and to the spare word lines are arranged so as to be divided on the right and left sides of the sub-array. As described above, the right lower sub-array is constituted by 512 pairs of complementary bit lines BL, and 256 sense amplifiers are arranged on the upper and lower sides in a manner as described above. 256 pairs of complementary bit lines formed for the sub-arrays SBARY, arranged on the right upper and lower sides, are commonly connected to the sense amplifiers SA sandwiched thereby through shared switching MOSFETs. Though not illustrated, spare bit lines are also provided and sense amplifiers corresponding thereto are arranged so as to be divided into the upper side and the lower side in the same manner as described above.

The main word lines MWL are extend as one of them is representatively illustrated. The column selection lines YS extend in the vertical direction as one of them is representatively illustrated. The sub-word lines SWL are arranged in parallel with the main word lines MWL, and complementary bit lines BL (not shown) are arranged in parallel with the column selection lines YS. For the above-mentioned four sub-arrays, eight sub-word selection lines FX0B to FX7B are extended so as to pass through the four sets of (eight) sub-arrays like the main word lines MWL. The four sub-word selection lines FX0B to FX3B and the four sub-word selection lines FX4B to FX7B are extended so as to be divided into those for the upper and lower sub-arrays. Thus, a set of sub-word selection lines FX0B to FX7B are allocated to the two sub-arrays and extend on the sub-arrays, in an attempt to decrease the size of the memory chip.

That is, when eight sub-word selection lines FX0B to FX7B are allocated to each sub-array and are formed into a wiring channel on the sense amplifier area, as many as 16 sub-arrays, as in the memory array of FIG. 4, are arranged in a total number of 32 in the upper and lower memory arrays. Accordingly, wiring channels of as many as 8×32= 256 are necessary. In the above-mentioned embodiment, on the other hand, eight sub-word lines FX0B to FX7B are allocated to the two sub-arrays and are arranged to pass on the sub-arrays, without the need for providing any particular wiring channel.

On the sub-array there is provided one main word line for eight sub-word lines, and sub-word selection lines are necessary for selecting one of the eight sub-word lines. The main word lines are formed at a rate of one per eight sub-word lines that are formed to match the pitch of the memory cells. Therefore, the main word lines are formed so as to maintain a wide pitch. By utilizing the same wiring layer as the main word line, therefore, the sub-word selection lines can be relatively easily formed among the main word lines.

When the first sub-word selection line FX0B extends in parallel with the main word line MWL, a second sub-word line FX0 is provided on the crossing area on the upper left part to supply selection signals to the sub-word drivers arranged up and down through the sub-word selection line drive circuit FXD that receives a selection signal from the first sub-word selection line FX0B. The first sub-word selection line FX0B extends in parallel with the main word line MWL and the sub-word line SWL, whereas the second sub-word selection line extends in parallel with the column selection lines YS and complementary bit lines BL that intersect therewith at right angles. For the above-mentioned eight first sub-word selection lines FX0B to FX7B, the second sub-word selection lines FX0 to FX7 are divided into even numbered lines FX0, FX2, FX4, FX6 and odd numbered lines FX1, FX3, FX5, FX7, and are arranged so as to be allocated to the sub-word drivers SWD provided on the right and left sides of the sub-array SBARY.

As indicated by solid squares (■) in FIG. 5, two each of sub-word selection line drive circuits FXD are arranged on the upper and lower parts of each crossing area. That is, in the left upper crossing area as described above, the sub-word selection line drive circuit arranged on the lower side corresponds to the first sub-word selection line FX0B, the two sub-word selection line drive circuits FXD provided in the left intermediate crossing area corresponded to the first sub-word selection lines FX2B and FX4B, and the sub-word selection line drive circuit arranged on the upper side in the lower left crossing area corresponds to the first sub-word selection line FX6B.

In the central upper crossing area, the sub-word selection line drive circuit arranged on the lower side is corresponded to the first sub-word selection line FX1B, the two sub-word selection line drive circuits FXD provided in the central intermediate crossing area correspond to the first sub-word selection lines FX3B and FX5B, and the sub-word selection line drive circuit arranged on the upper side in the central lower crossing area corresponds to the first sub-word selection line FX7B. The sub-word selection line drive circuit arranged on the lower side in the upper right crossing area is corresponds to the first sub-word selection line FX0B, the two sub-word selection line drive circuits FXD provided in the right intermediate crossing area are correspond to the first sub-word selection lines FX2B and FX4B, and the sub-word selection line drive circuit arranged on the upper side in the lower right crossing area is corresponds to the first sub-word selection line FX6B. Thus, the sub-word drivers provided at the end of the memory array drive the sub-word lines SWL of the left side only since there exists no sub-array on the right side.

In the constitution in which the sub-word selection lines are arranged between the pitches of the main word lines on the sub-array as in this embodiment, no particular wiring channel is required. Therefore, even when eight sub-word lines are arranged on a sub-array, the size of the memory chip does not increase. However, the area increases due to the formation of the above-mentioned sub-word selection line drive circuits FXD, thereby interferring with the effort for accomplishing a high degree of integration. This is because the crossing area has no extra area due to the formation of peripheral circuits, such as switching circuits IOSW corresponding to the main input/output lines MIO and sub-input/output lines LIO indicated by dotted lines, power MOSFETs for driving the sense amplifiers, drive circuits for driving shared switching MOSFETs and drive circuits for driving precharging MOSFETs.

In the sub-word drivers, the second sub-word selection lines FX0 to FX6 are provided with wirings in parallel therewith to pass selection signals corresponding to the first sub-word selection lines FX0B to FX6B. However, since the load is so small, as will be described later, there is no need for providing a particular driver FXD unlike the second sub-word selection lines FX0 to FX6, and the wirings are directly connected to the first sub-word selection lines FX0B to FX6B. However, the wiring layer is the same as that of the second sub-word selection lines FX0 to FX6.

Among the above-mentioned crossing areas, those corresponding to even numbers, and which are arranged in the direction A in which the second sub-word selection lines FX0 to FX6 extend, are provided with an N-channel power MOSFET that supplies a constant internal voltage VDL to the sense amplifiers as denoted by P in a circle, a P-channel power MOSFET that supplies a clamp voltage VDDCLP for over-driving, that will be described later, to the sense amplifiers as denoted by 0 in a circle, and an N-channel power MOSFET that supplies a ground potential VSS of the circuit to the sense amplifiers as denoted by N in a circle.

Among the above-mentioned crossing areas, those corresponding to odd numbers, and which are arranged in the direction B in which the second sub-word selection lines FX0 to FX6 extend, are provided with an N-channel drive MOSFET that turns off the MOSFET for precharging and equalizing the bit lines as denoted by B in a circle, and an N-channel power MOSFET that supplies the ground potential VSS of the circuit to the sense amplifiers as denoted by N in a circle. The N-channel power MOSFETs supply ground potential to the sources of amplifier MOSFETs of the N-channel type constituting the sense amplifiers from both sides of the sequence of sense amplifiers. That is, 128 or 130 sense amplifiers provided on the sense amplifier area are supplied with ground potential from both the N-channel power MOSFETs provided on the crossing areas of the side A and the n-channel power MOSFETs provided on the crossing areas of the side B.

As described above, the sub-word line drive circuits SWD select sub-word lines of sub-arrays of both sides with the sub-word line drive circuits SWD as a center. On the other hand, the two sense amplifiers are activated in response to the sub-word lines of the two sub-arrays that are selected. That is, when the sub-word line is selected, the address-selecting MOSFET is turned on, and the electric charge of the memory capacitor is synthesized with the electric charge on the bit line. In this case, it becomes necessary to activate the sense amplifier to execute the rewriting operation in order to return the state of electric charge to the initial state. Therefore, with the exception of those corresponding to the sub-arrays at the ends, the power MOSFETs denoted by P, O and N are used for activating the sense amplifiers on both sides by which they are sandwiched. On the other hand, the sub-word line drive circuit SWD provided on the right side of the sub-array formed at an end of the memory array selects a sub-word line of the sub-array only. Therefore, the power MOSFETs denoted by P, O and N activate only those sense amplifiers corresponding to the above sub-arrays.

The sense amplifiers are of the shared sense type. When the shared switching MOSFETs corresponding to the complementary bit lines on the side where the sub-word lines are not selected, are turned off and cut off from those sub-arrays arranged on both sides of the sense amplifiers, the sense amplifiers amplify the read signals of the complementary bit lines corresponding to the selected sub-word lines, and execute the rewriting operation to return the memory capacitors of the memory cells to the initial state of electric charge.

Figure 6:
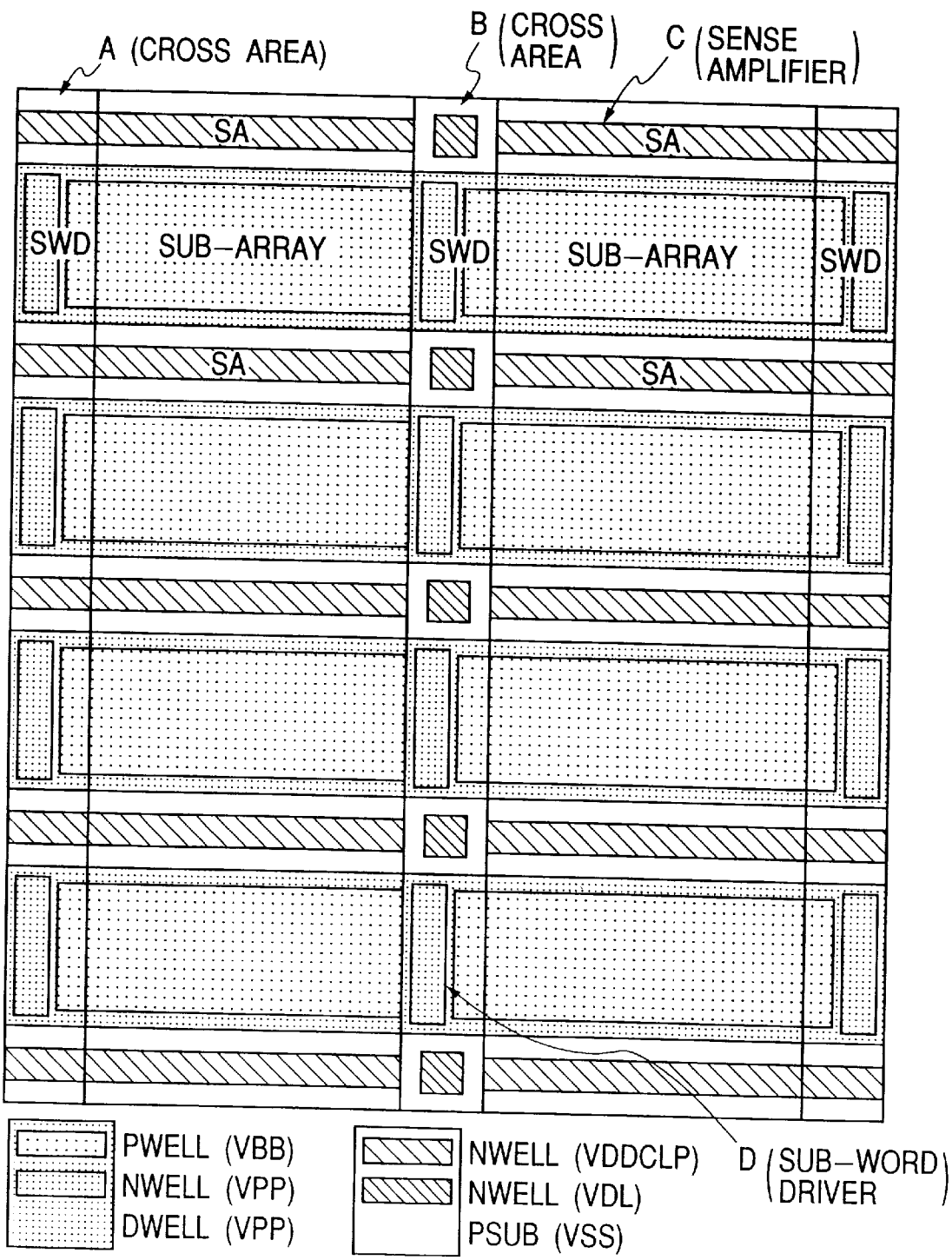
FIG. 6 is a diagram schematically illustrating the layout of sub-arrays and well regions forming the peripheral circuits thereof in the dynamic RAM according to the embodiment of the present invention.

FIG. 6 is a diagram schematically illustrating the layout of the sub-arrays and well regions forming the peripheral circuits thereof in the dynamic RAM according to an embodiment of the present invention. FIG. 6 representatively illustrates eight sub-arrays inclusive of four sub-arrays SBARY arranged at shaded positions like those surrounded by a dashed line in the memory array shown in FIG. 4.

In FIG. 6, white portions represent a P-type substrate (PSUB). The P-type substrate PSUB is supplied with the ground potential VSS of the circuit. On the P-type substrate PSUB there are formed two kinds of N-type well regions NWELL (VDL) and NWELL (VDDCLP) as indicated by shaded portions. That is, a clamp voltage VDDCLP formed by utilizing a boosting voltage VPP is supplied to the N-type well region where the P-channel amplifier MOSFET is formed to constitute a sense amplifier SA and to the N-type well region where the power switching MOSFET is formed so as to be arranged in the crossing area of column A.

In the crossing area of column B there is formed the N-type well region in which are formed the P-channel MOSFET for constituting the switching circuit IOSW that corresponds to the sub-input/output line LIO and the p-channel MOSFET for precharging and equalizing in the main input/output line, which is supplied with an internal voltage VDL formed by stepping down the voltage.

A generally deep N-type well region DWELL is formed and in this region DWELL there are formed sub-arrays and sub-word line drive circuits SWD. The deep N-type well region is supplied with a boosted voltage VPP which corresponds to the word line selection level. In the deep N-type well region DWELL there formed an N-type well region NWWLL in which there is formed the P-channel MOSFET that constitutes the sub-word line drive circuit SWD. Like the deep N-type well region DWELL, the N-type well region NWWLL is supplied with the boosted voltage VPP.

In the deep N-type well region DWELL there is formed a P-type well region PWELL for forming an N-channel address-selecting MOSFET for constituting a memory cell and an N-channel MOSFET of a sub-word drive circuit SWD. To the P-type well regions PWELL there is supplied a substrate back bias voltage VBB of negative voltage.

When reference is made to one of the eight/split arrays shown in FIG. 4, 16 deep N-type well regions DWELL are formed as a whole so as to be arranged in the direction of the bit lines with eight sub-arrays arranged in the direction of the word lines as a unit. The crossing areas corresponding to the sub-word drivers arranged at both ends of the main word lines extending on the array are the column A, and are alternatingly arranged like those of column B. Except for the ends, therefore, there are commonly formed N-type well regions NWELL (VDDCLP) for forming P-channel MOSFETs of two sense amplifiers arranged on the column A and on both sides thereof.

Figure 7:
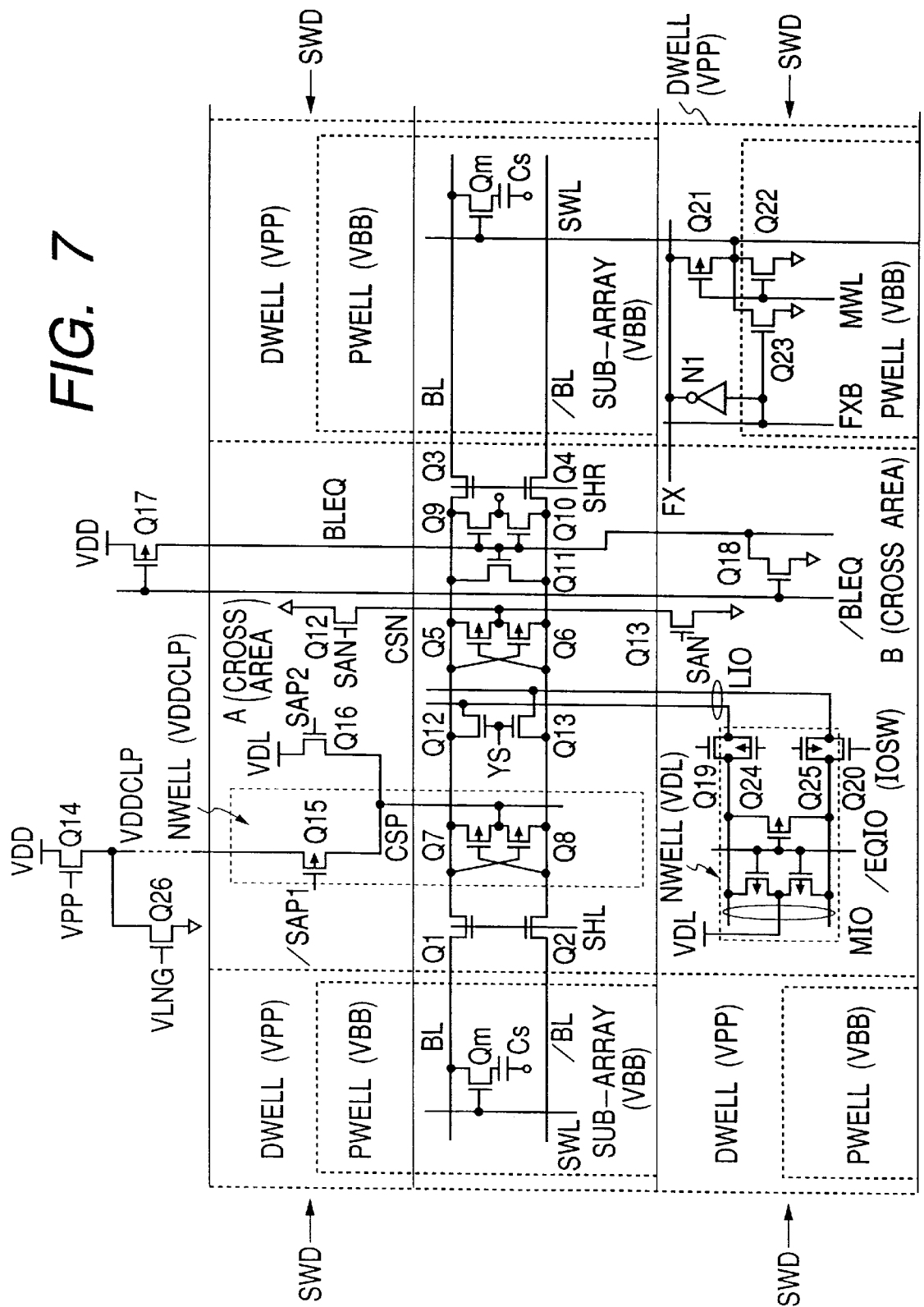
FIG. 7 is a circuit diagram illustrating major portions in the sense amplifier unit and in the peripheral circuits thereof in the dynamic RAM according to the embodiment of the present invention.

FIG. 7 is a circuit diagram illustrating major portions of a sense amplifier unit and the peripheral circuits thereof in the dynamic RAM according to an embodiment of the present invention. FIG. 7 illustrates sense amplifiers arranged so as to be sandwiched by the two sub-arrays and the related circuits. Furthermore, the well regions where the elements are formed are indicated by dashed lines, and bias voltages applied thereto are also shown.

There is representatively shown a dynamic memory cell provided between a sub-word line SWL and either one of the complementary bit lines BL, /BL. The dynamic memory cell is constituted by an address-selecting MOSFET Qm and a memory capacitor Cs. The gate of the address-selecting MOSFET Qm is connected to the sub-word line SWL, the drain of MOSFET Qm is connected to the bit line BL, and the memory capacitor Cs is connected to the source thereof. The other electrode of the memory capacitor Cs is used in common and is supplied with a plate voltage. The selection level of the sub-word line SWL is of a high voltage VPP obtained by adding a threshold voltage of the address-selecting MOSFET Qm to the high level of the bit line.

When the sense amplifier that will be described later is operated at an internal step-down voltage VDL, the high level amplified through the sense amplifier and applied to the bit line is changed to a level that corresponds to the above internal voltage VDL. Therefore, the high voltage VPP corresponding to the selection level of the word line is set to be VDL+Vth. The pair of complementary bit lines BL and /BL of the sub-array provided on the left side of the sense amplifiers are arranged in parallel as shown and are, as required, suitably intersected to maintain a capacity balance for the bit lines. Such complementary bit lines BL and /BL are connected to the input/output nodes of a unit circuit of the sense amplifier through shared switching MOSFETs Q1 and Q2.

The unit circuit of the sense amplifier is constituted by N-channel amplifier MOSFETs Q5 and Q6 of a latch form in which the gates and the drains are connected in an intersecting manner, and P-channel amplifier MOSFETs Q7 and Q8. The sources of the N-channel MOSFETs Q5 and Q6 are connected to a common source line CSN. The sources of the P-channel MOSFETs Q7 and Q8 are connected to a common source line CSP. The common source lines CSN and CSP are provided with a power switch MOSFET, respectively. Though there is no particular limitation, to the common source line CSN to which the sources of the N-channel amplifier MOSFETs Q5 and Q6 are connected, there is applied an operation voltage corresponding to ground potential due to the N-channel power switching MOSFETs Q12 and Q13 formed in the crossing areas of the side A and of the side B.

Though there is no particular limitation, the common source line CSP to which the sources of the P-channel amplifier MOSFETs Q7 and Q8 are connected, is provided with a P-channel power MOSFET Q15 for over-driving formed in the crossing area of the side A and with an N-channel power MOSFET Q16 for supplying the internal voltage VDL. The voltage for over-driving is a clamp voltage VDDCLP formed by the N-channel MOSFET Q14 which is supplied with a boosted voltage VPP through the gate thereof. The power source voltage VDD is supplied from an external terminal to the drain of the MOSFET Q14 which, then, operates as a source-follower output circuit to form a clamp voltage VDDCLP which is lowered by the threshold voltage of the MOSFET Q14 with the boosted voltage VPP as a reference.

Though there is no particular limitation, the boosted voltage VPP assumes a stabilized high voltage of, for example, 3.8 V as a result of controlling the operation of the charge pump circuit by using a reference voltage. The threshold voltage of the MOSFET Q14 is lower than that of the address-selecting MOSFET Qm of the memory cell, and the clamp voltage VDDCLP assumes a stabilized constant voltage of, for example, about 2.9 V. The MOSFET Q26 forms a leakage current passage and permits the flow of a very small current of about 1 $\mu$A. This prevents the VDDCLP from excessively rising due to the standby condition (inoperating condition) for extended periods of time or due to bumping of the power source voltage VDD, and prevents the delay in the operation caused by the back bias effect of the amplifier MOSFETs Q7 and Q8 to which the excessively increased voltage VDDCLP is applied.

In this embodiment, the P-channel power MOSFET Q15 for supplying the over-driving voltage and the P-channel amplifier MOSFETS Q7 and Q8 of the sense amplifier are formed in the same N-type well region NWELL as indicated by a dashed line in FIG. 7, and the clamp voltage VDDCLP is applied as a bias voltage in view of the fact that the over-driving voltage for the sense amplifier is formed by the clamp voltage VDDCLP. The power MOSFET Q16, which gives its inherent operation voltage VDL to the common source line CSP of the P-channel amplifier MOSFETs Q7 and Q8 of the sense amplifier, is electrically separated as the N-channel one from the MOSFET Q14 for over-driving.

A sense amplifier activating signal SAP2 supplied to the gate of the N-channel power MOSFET Q15 has a phase opposite to that of an activating signal /SAP1 for over-driving fed to the gate of the P-channel MOSFET Q15, and a high level thereof serves as a signal corresponding to the power source voltage VDD, though there is no particular limitation. That is, the voltage VDDCLP is about +2.9 V, and an allowable minimum voltage VDDmin of the power source voltage VDD is about 3.0 V. Therefore, the P-channel MOSFET Q15 can be turned off. By using the N-channel MOSFET Q16 having a low threshold voltage, furthermore, a voltage corresponding to the internal voltage VDL can be output from the source side.

The input/output node of a unit circuit of the sense amplifier is provided with a precharging circuit constituted by an equalizer MOSFET Q11 for short-circuiting the complementary bit lines, and switching MOSFETs Q9 and Q10 for feeding a half precharging voltage to the complementary bit lines. A precharging signal BLEQ is commonly fed to the gates of the MOSFETs Q9 to Q11. A driver circuit for forming the precharging signal BLEQ is provided with an N-channel MOSFET Q18 on the crossing area of the side B so that the signal can fall at a high speed. That is, in order to quicken the timing for selecting the word line upon the start of memory access, the N-channel MOSFETs Q18 formed in the crossing areas are turned on in order to quickly turn off the MOSFETs Q9 to Q11 that constitute the precharging circuit.

On the other hand, the P-channel MOSFET Q17 that forms a signal for starting the precharging operation is not provided on the crossing area, but is provided in the Y-decoder & YS-driver unit. That is, the precharging operation starts at the end of the memory access. The operation, however, has a time margin, and the signal BLEQ need not be raised at a high speed. Accordingly, the P-channel MOSFET provided on the crossing area of the side A is only the power MOSFET Q15 for over-driving, and the P-channel MOSFETs provided on the crossing area of the side B include MOSFETs Q24, Q25 constituting the switching circuit IOSW for the input/output lines that will be described below and a MOSFET constituting a precharging circuit for precharging the common input line MIO to the internal voltage VDL. The N-type well regions are applied with bias voltages such as VDDCLP and VDL and are, hence, those of the one kind where no parasitic thyristor element is formed.

A unit circuit of the sense amplifier is connected to similar complementary bit lines BL, /BL of the sub-array of the right side through shared switching MOSFETs Q3 and Q4. The switching MOSFETs Q12 and Q13 constitute a column switching circuit which, upon receipt of a selection signal YS, connects the input/output node of the unit circuit of the sense amplifier to the sub-common input/output line LIO. For example, when a sub-word line SWL of the sub-array of the left side is selected, the shared switching MOSFETs Q3 and Q4 of the right side of the sense amplifier are turned off. Thus, the input/output node of the sense amplifier is connected to the complementary bit lines BL, /BL of the left side to amplify a very small signal of a memory cell which is connected to the selected sub-word line SWL and to transmit it to the sub-common input/output line LIO through the column switching circuit. The sub-common input/output line is connected to the input/output line MIO connected to the input terminal of the main amplifier through the switching circuit IOS constituted by N-channel MOSFETs Q19, Q20 and P-channel MOSFETs Q24, Q25 provided on the crossing area of the side B.

One of the sub-word line drive circuits SWD is representatively shown, which is constituted by the P-channel MOSFET Q21 formed in the deep N-type well region DWELL (VPP) and the N-channel MOSFETs Q22 and Q23 formed in the P-type well region PWELL (VBB) formed in the DWELL. Though there is no particular limitation, the inverter circuit N1 constitutes the sub-word selection line drive circuit FXD as shown in FIG. 3, and is formed in the crossing area as described above. The address-selecting MOSFET Qm, too, of the sub-array is formed in the P-type well region PWELL (VBB) formed in the DWELL.

Figure 8:
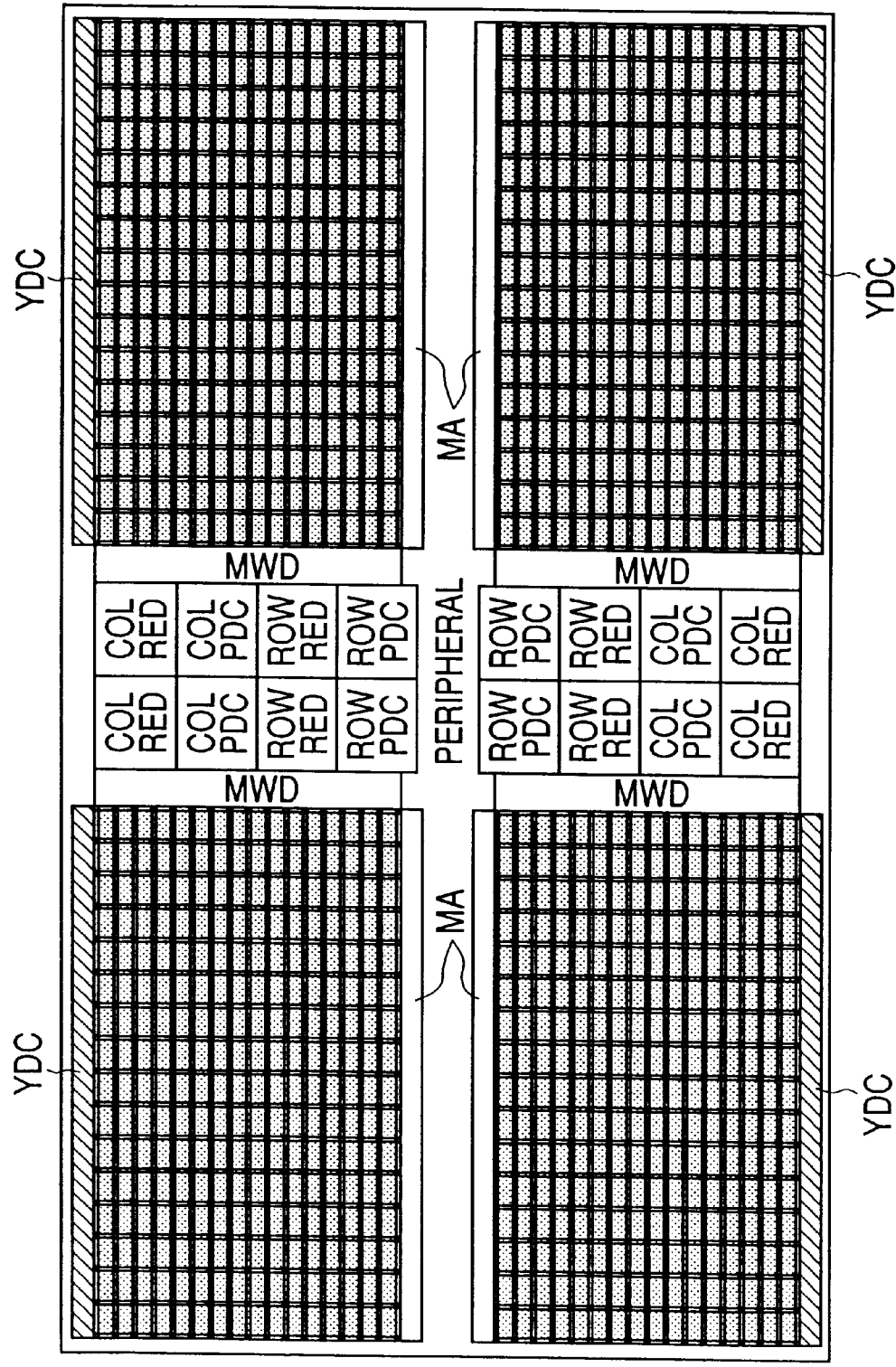
FIG. 8 is a diagram schematically illustrating the layout of the dynamic RAM according to another embodiment of the present invention.

FIG. 8 is a diagram schematically illustrating the layout of the dynamic RAM according to another embodiment of the present invention. In this embodiment, the memory array as a whole is divided into four groups. Two each of the divided memory arrays are provided on the upper side and on the lower side along the lengthwise direction of the semiconductor chip, and two each are provided on the right side and on the left side. Peripheral circuits, such as address input circuits, data input/output circuits and input/output interface circuits constituted by sequences of bonding pads, are formed in the central portion along the lengthwise direction of the chip like the one described earlier. Main amplifiers MA are arranged on the center side of the memory arrays.

In the four memory arrays, two on the upper side and two on the lower side along the lengthwise direction of the semiconductor chip, and two on the right side and two on the left side as described above, X-system predecoder circuits ROWPDC, relief circuits ROWRED and Y-system predecoder circuits COLPDC and relief circuits COLRED are collectively arranged in an intermediate portion in the right-and-left direction relative to the lengthwise direction. That is, for the four memory arrays, there are arranged two sets each of X-system predecoder circuits ROWPDC, relief circuits ROWRED and Y-predecoder circuits COLPDC and relief circuits COLRED allocated to two each of memory arrays arranged on the right side and on the left side.

The main word driver regions MWD are formed along the intermediate portion of the memory arrays like the one described earlier to drive the main word lines that are arranged to extend toward the lower side and the upper side of the memory arrays. When the sub-arrays like those described above are used in this constitution, the main word lines are extended so as to pass through 16 sub-arrays. In the above-mentioned memory arrays, the Y-decoders YDC are provided on the peripheral sides of the chip opposite to the central portion of the chip. That is, in this embodiment, too, the four memory arrays are sandwiched by the main amplifiers MA arranged on the center side and the Y-decoders YDC arranged on the peripheral sides.

Figure 9:
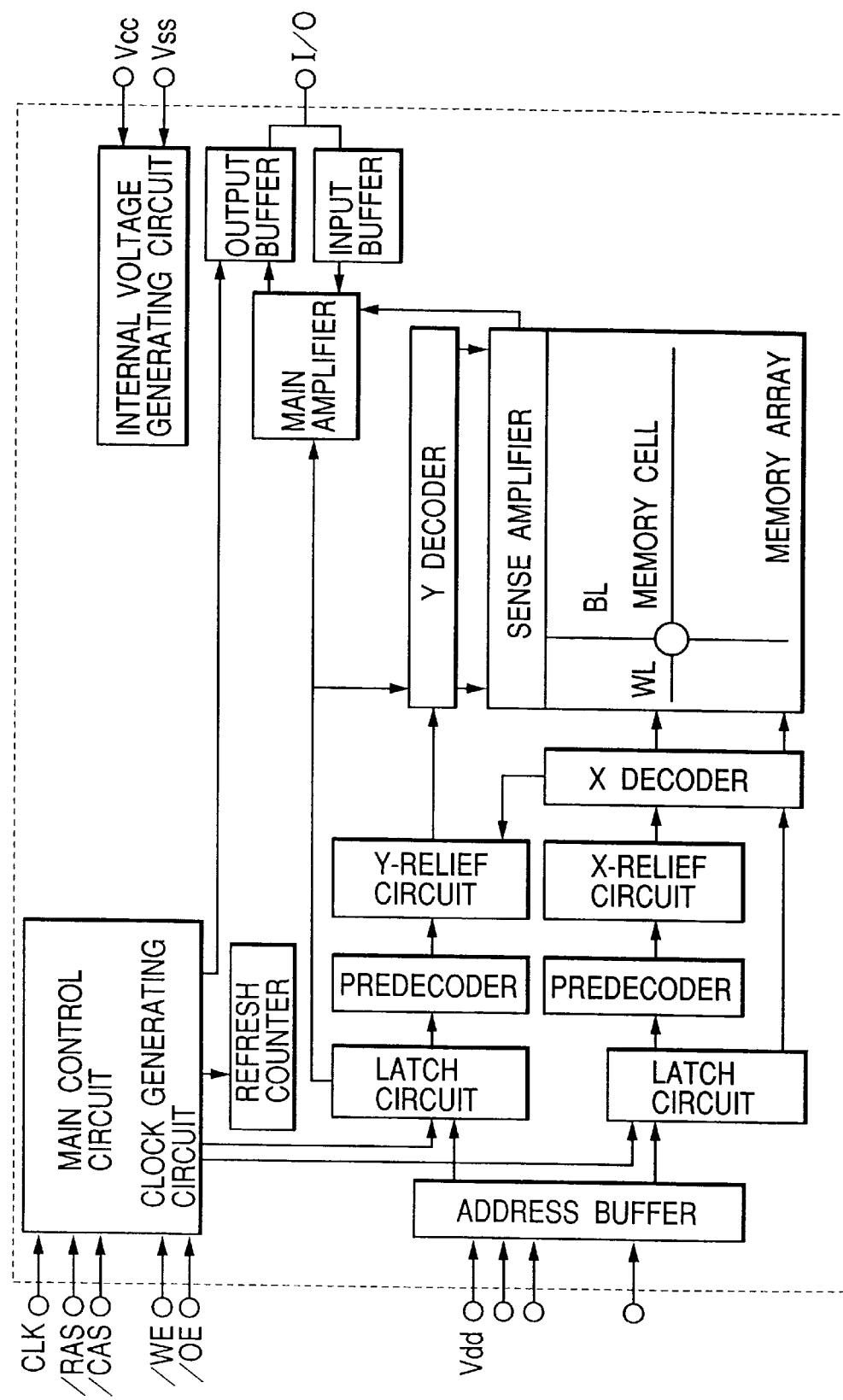
FIG. 9 is an overall block diagram illustrating the dynamic RAM according to the embodiment of the present invention.

FIG. 9 is an overall block diagram illustrating a dynamic RAM according to the embodiment of the present invention. Control input signals include a row address strobe signal /RAS, a column address strobe signal /CAS, a write enable signal /WE and an output enable signal /OE. Here, the sign / corresponds to an over bar which is a logic sign indicating that the low level is an active level. The X-address signal and the Y-address signal are input in time series through a common address terminal Add in synchronism with the row address strobe signal /RAS and the column address strobe signal /CAS.

The X-address signal and the Y-address signal input through the address buffer are received by the latch circuits. The X-address signal received by the latch circuit is supplied by the predecoder mentioned above, and its output signal is fed to the X-decoder thereby to form a selection signal for the word line WL. In the operation for selecting the word line, the read signal appears on the complementary bit lines of the memory array, and an amplification operation is executed by the sense amplifier. The Y-address signal received by the latch circuit is fed to the predecoder like the one mentioned above, and its output signal is fed to the Y-decoder thereby to form a signal for selecting a bit line DL. The X-relief circuit and the Y-relief circuit compare the operation for storing a defective address with the stored defective address and the address signal that is received. When they are in agreement, the X-relief circuit and the Y-relief circuit instruct the X-decoder and the Y-decoder to select a spare word line or a spare bit line and inhibit the operation for selecting a regular word line or a regular bit line.

The stored data amplified by the sense amplifiers are selected by column switching circuits that are not shown, and are connected to the common input/output line and are transmitted to the main amplifier. Though there is no particular limitation, the main amplifier also works as a writing circuit. That is, during the reading operation, the main amplifier amplifies the read signal read out through the Y-switching circuit and produces it through the output buffer and the external terminal I/O. During the writing operation, a write signal is received through the external terminal I/O and the input buffer, and is transmitted to the common input/output line and the selection bit line through the main amplifier. The selection bit line receives the write signal amplified by the sense amplifier, and an electric charge corresponding thereto is held in the capacitor of the memory cell.

The clock generating circuit (main control circuit) generates a variety of timing signals necessary for the operation for selecting memory cells, such as an address signal reception control timing signal input in response to the above-mentioned signals /RAS and /CAS, and a sense amplifier operation timing signal. The internal power source generating circuit receives operation voltages such as Vcc and Vss supplied through the power source terminals, and generates various internal voltages such as the plate voltage, a pre-charging voltage like Vcc/2, an internal boosted voltage VCH, an internal step-down voltage VDL, and a substrate back bias voltage VBB. In the refresh mode, the refresh counter forms an address signal for refreshing which is used in the X-system selection operation.

Figure 10:
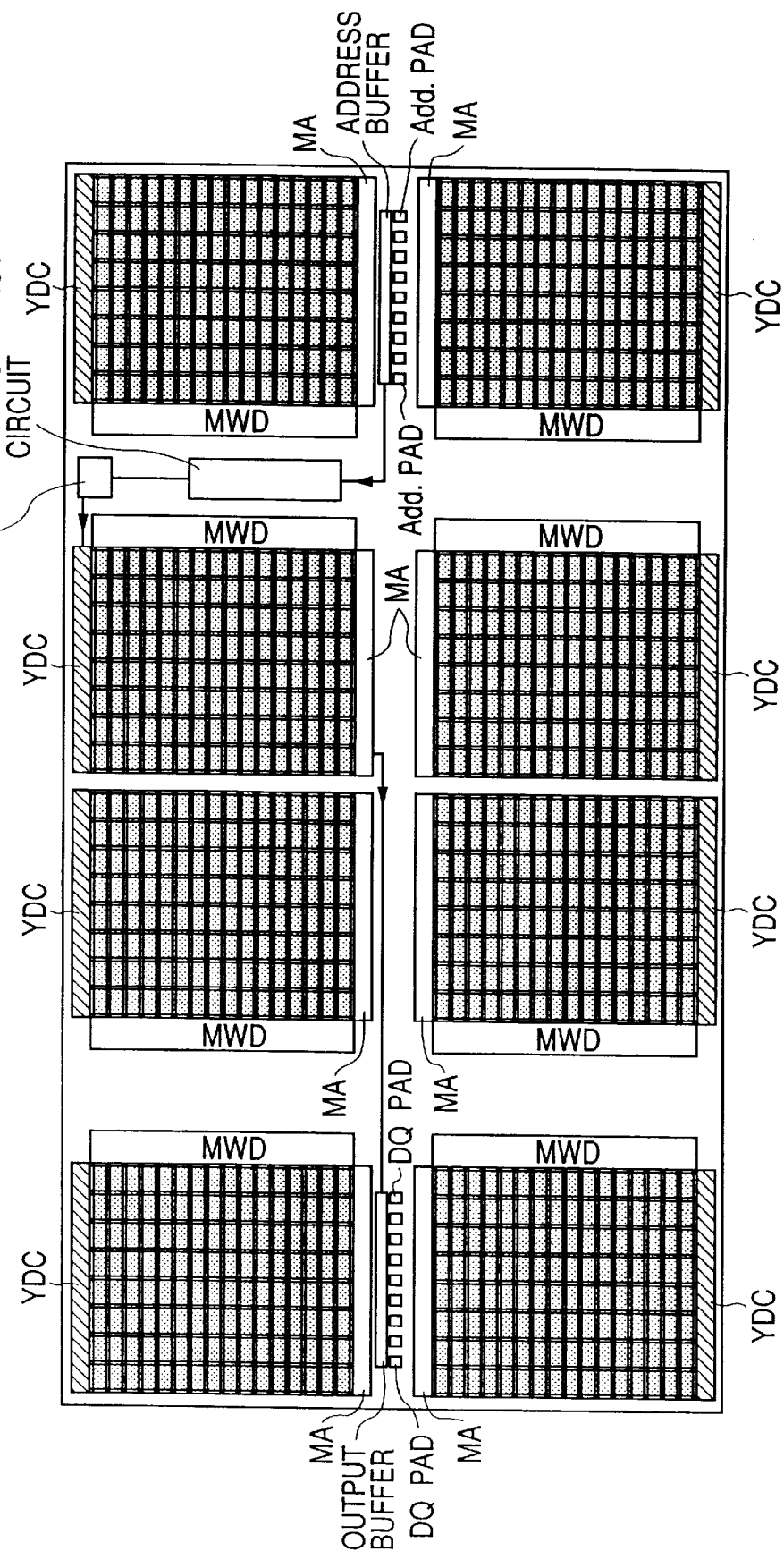
FIG. 10 is a diagram schematically illustrating the layout of the dynamic RAM according to the embodiment of the present invention.

FIG. 10 is a diagram schematically illustrating the layout for explaining the operation of the dynamic RAM according to the present invention. Address pads Add.PAD, address buffers, data pads DQPAD, output buffers and main amplifiers MA are arranged in the first region passing through the center of the chip, and Y-decoders are arranged in the second region in the periphery of the chip. The memory arrays are arranged in the array regions sandwiched by the first region and the second region. The Y-redundancy circuit and the Y-predecoder are arranged in a signal passage extending from the address buffer to the Y-decoder. In FIG. 10, the first region is provided along a line that traverses the center of a short side of the chip, and the second region is provided along both long sides of the chip. The Y-redundancy circuit and the Y-predecoder are arranged in a third region extending along a line traversing the long side of the chip. In the third region there is arranged a main word line drive circuit MWD.

The Y-address input to the address pad Add.PAD is supplied to the Y-redundancy circuit provided in the third region passing through the address buffer. The Y-redundancy circuit judges whether the Y-address is defective or not. Relying upon the result of this judgement, the Y-predecoder and the Y-decoder YDC operate. Due to the Y-selection signal formed by the Y-decoder YDC, the complementary bit lines are selected. The signals that are read out are amplified through the main amplifiers, and are output from the output pads DQPAD through the output buffer.

The defective address-judging circuit in the redundancy circuit in many cases contains fuse elements which are, as required, blown in the final step after having tested the circuit operation. Therefore, the fuse elements are formed in the uppermost layer of the semiconductor substrate. It is therefore difficult to form a wiring layer for other circuits on the upper layer of the redundancy circuit. It is not therefore advantageous to arrange the redundancy circuit in the region where the wiring layers are densely collected. In this embodiment, the redundancy circuit is formed in the third region avoiding the second region where the wiring layers are relatively densely collected, making it possible to effectively use the second region. Besides, no folded signal line is provided from the redundancy circuit to the Y-decoder YDC to cause a delay of the signals while they are transmitted through the signal passage. This makes it possible to minimize the delay before the Y-decoder YDC operates after the redundancy circuit has produced the result of judgement. Therefore, a high-speed operation can be accomplished.

The above-mentioned embodiments exhibit the following actions and effects (1) A semiconductor storage device is provided in which electrodes are provided so as to be arranged in the central portion so as to divide, into two segments, a semiconductor chip that is to be connected to the external lead terminals, an address buffer is provided neighboring those electrodes which receive address signals among said electrodes, a plurality of memory cells are arranged in the form of a matrix at points where a plurality of word lines intersect a plurality of bit lines, thereby to constitute memory arrays that are divided into at least two groups sandwiching the central portion of the chip where said plurality of electrodes are formed, an address decoder for selecting said word lines or said bit lines is provided on a peripheral side of the semiconductor chip opposite to the central portion where the electrodes of the semiconductor chip are formed, and a predecoder for decoding the address signals is arranged in an intermediate portion from said central portion to a portion where said address decoder is provided. This makes it possible to avoid overcrowded wirings, to shorten the signal transmission passages and to increase the speed of operation.

(2) The memory array is provided with spare word lines and spare bit lines for relieving defects, and a relief circuit is arranged near a portion where the predecoder is arranged in order to detect a defective address and to select a spare word line or a spare bit line. At the time of relieving a defect, therefore, this makes it possible to avoid overcrowded wirings, to shorten the signal transmission passages and to increase the speed of operation.

(3) The address decoder for forming a signal for selecting a bit line is provided on the peripheral side of the semiconductor chip, and in the central portion of the semiconductor chip there are formed a main amplifier for amplifying a signal read from the memory cell and a write amplifier for forming a write signal that will be fed to said memory cell, and an address decoder for forming a signal for selecting a word line is formed adjacent to the memory array along the intermediate portion where the predecoder is arranged. This makes it possible to avoid overcrowded wirings and to shorten the time-required for inputting and outputting data to, and from, the Y-selection operation.

(4) The memory array is divided into two at the central portion and is further divided into four in a direction at right angles therewith, and the predecoders are arranged in the intermediate portions between the two sets of neighboring memory arrays. This makes it possible to increase the memory capacity, to avoid overcrowded wirings and to shorten the signal transmission passages.

(5) The bit line comprises a pair of complementary bit lines formed by folding, dynamic memory cells are arranged at points where one of such complementary bit lines intersects said word lines to constitute a memory array, said complementary bit lines and word lines are arranged so as to be allocated to a plurality of divided sub-arrays, and said sub-arrays are arranged in a manner that:

sub-word line drive circuits are arranged so as to be allocated to both end sides of the arrangement of said plurality of sub-word lines;

sense amplifiers are arranged so as to be allocated to both end sides of the arrangement of said plurality of complementary bit lines; and one of said sub-arrays is surrounded by a sequence of said plurality of sub-word line drive circuits and a sequence of said plurality of sense amplifiers;

main word lines are provided so as to be corresponded to said complementary bit lines in a direction at right angles therewith, and a plurality of sub-word lines are allocated to said one main word line, and a sub-word line is selected by said one main word line and a sub-word selection line which transmits a signal for selecting one sub-word line out of the plurality of sub-word lines. This makes it possible to realize a large memory capacity.

(6) The sense amplifiers are of the shared sense type and are provided to be correspond to the bit lines in the sub-arrays which are neighboring each other with the sense amplifiers in the center, and the sub-word line drive circuits select sub-word lines in the sub-arrays which are neighboring each other with the sub-word line drive circuits in the center. This makes it possible to efficiently lay out the sense amplifiers and the sub-word line drive circuits to match the pitch of the sub-word lines and the bit lines.

In the foregoing the invention accomplished by the present inventors was described by way of various embodiments. It should, however, be noted that the present invention is in no way limited to the above-mentioned embodiments only but can be modified in a variety of ways without departing from the scope of the present invention. For example, the constitution of sub-arrays or the arrangement of a plurality of memory arrays mounted on a semiconductor chip, can be changed in a variety of ways depending upon the memory capacity, etc. Furthermore, the constitution of the sub-word drivers can be varied in a variety of ways. The input/output interface portion may be in the form of a synchronous dynamic RAM which executes a reading/writing operation according to the clock signals. The number of the sub-word lines allocated to the one main word line may be variously changed, such as eight, in addition to four. The memory cells may be dynamic memory cells, static memory cells, or nonvolatile memory cells. The semiconductor storage device of the present invention can be extensively utilized.

Briefly described below are the effects obtained by a representative example of the invention disclosed in this application. That is, a semiconductor storage device is provided in which electrodes are provided so as to be arranged in the central portion so as to divide, into two segments, a semiconductor chip that is to be connected to the external lead terminals, an address buffer is provided neighboring those electrodes which receive address signals among said electrodes, a plurality of memory cells are arranged in the form of a matrix at points where a plurality of word lines intersect a plurality of bit lines thereby to constitute memory arrays that are divided into at least two groups sandwiching the central portion of the chip where said plurality of electrodes are formed, an address decoder for selecting said word lines or said bit lines is provided on a peripheral side of the semiconductor chip opposite to the central portion where the electrodes of the semiconductor chip are formed, and a predecoder for decoding the address signals is arranged in an intermediate portion from said central portion to a portion where said address decoder is provided. This makes it possible to avoid overcrowded wirings, to shorten the signal transmission passages and to increase the speed of operation.

We claim:

1. A semiconductor storage device comprising:
    a plurality of electrodes arranged in the central portion of a semiconductor chip so as to divide the semiconductor chip into two segments;
    an address buffer neighboring those electrodes which receive address signals;
    a memory array that is divided into at least two groups sandwiching said central portion of the chip, and including a plurality of memory cells arranged in the form of a matrix at points where a plurality of word lines intersect a plurality of bit lines;
    an address decoder provided by a side of the semiconductor chip opposite to the central portion across a corresponding group of said memory array so that said corresponding group of said memory array is sandwiched between said address decoder and electrodes and address buffer in the central portion in order to select said word lines or said bit lines; and
    a predecoder arranged on an intermediate portion extending from said central portion to a portion where said address decoder is provided.

2. The semiconductor storage device according to claim 1, wherein said memory array includes spare word lines and spare bit lines for relieving a defect, and a relief circuit is arranged near a portion where said predecoder is arranged in order to detect a defective address and to select a spare word line or a spare bit line.

3. The semiconductor storage device according to claim 2, wherein said address decoder is a Y-address decoder for forming a signal for selecting a bit line; and in the central portion of said semiconductor chip there are formed a main amplifier for amplifying signals read from said memory cells and a write amplifier for forming write signals that are to be fed to said memory cells, and an X-address decoder for forming a signal for selecting a word line is formed adjacent to the memory array along an intermediate portion where said predecoder is arranged.

4. The semiconductor storage device according to claim 3, wherein said memory array is divided into two groups at the central portion and each group is further divided into two memory arrays, and the predecoder is arranged in the intermediate portion between the two neighboring memory arrays in each group.

5. The semiconductor storage device according to claim 4, wherein said bit line has a pair of complementary bit lines, dynamic memory cells are arranged at points where one of such complementary bit lines intersects said word lines to constitute a memory array, said dynamic memory cells complementary bit lines and word lines are arranged so as to be allocated to a plurality of sub-arrays formed by being divided into a plurality of groups, and said sub-arrays are arranged in a manner that:
    sub-word lines drive circuits are arranged so as to be allocated to both end sides of the arrangement of a plurality of sub-word lines;
    sense amplifiers are arranged so as to be allocated to both end sides of the arrangement of said plurality of complementary bit lines; and
    one of said sub-arrays is surrounded by a sequence of said plurality of sub-word line drive circuits and a sequence of said plurality of sense amplifiers;
    main word lines are provided so as to correspond to said complementary bit lines in a direction at right angles therewith, a plurality of sub-word lines are allocated to one main word line, and a sub-word line is selected by said one main word line and a sub-word selection line which transmits a signal for selecting one sub-word line out of the plurality of sub-word lines.

6. The semiconductor storage device according to claim 5, wherein said sense amplifiers are of the shared sense type and are provided to be correspond to the bit lines in the sub-arrays which are neighboring each other with the sense amplifiers as a center, and the sub-word line drive circuits operate to select sub-word lines in the sub-arrays which are neighboring each other with the sub-word line drive circuits as a center.

7. A semiconductor storage device formed in a square region comprising a first region extending along a line that traverses a first side of said semiconductor storage device, a second region extending neighboring a second side which neighbors said first side, and a third region extending along a line that traverses said second side; wherein address pads and an address buffer are provided in said first region;

an address decoder is provided in said second region;

a defective address-judging circuit is provided in said third region; and memory array regions are provided in contact with said first, second and third regions, respectively, so that at least one of said memory array regions is sandwiched between the address decoder in the second region and the address pads and address buffer in the first region.

8. The semiconductor storage device according to claim 7, wherein:

said address buffer receives Y-address signals through said address pads;

said defective address-judging circuit judges whether the Y-address signals received from said address buffer are defective addresses or not; and said address decoder operates based upon the result of judgement by said defective address-judging circuit.

9. The semiconductor storage device according to claim 8, wherein:

a plurality of word lines, a plurality of bit lines, a plurality of memory cells and a plurality of sense amplifiers are provided in said memory array regions;

a main amplifier is included in said first region;

a bit line selection signal is formed by said address decoder; and a signal obtained from a selected bit line is amplified through said main amplifier.

10. The semiconductor storage device according to claim 9, wherein a predecoder connected to said address decoder is provided in said third region.

11. A semiconductor storage device formed in a rectangular region comprising a first region extending along a line that traverses a first side of said semiconductor storage device, a second region extending along a second side which neighbors said first side, and a third region extending along a line that traverses said second side; wherein address pads and an address buffer are provided in said first region;

an address decoder is provided in said second region;

a predecoder is provided in said third region; and memory array regions are provided in contact with said first, second and third regions, respectively, so that at least one of said memory array regions is sandwiched between the address decoder in the second region and the address pads and address buffer in the first region.

12. The semiconductor storage device according to claim 11, wherein:

said address buffer receives Y-address signals through said address pads;

said predecoder predecodes the Y-address signals received from said address buffer; and said address decoder operates upon receiving an output signal from said predecoder.

13. The semiconductor storage device according to claim 12, wherein:

a plurality of word lines, a plurality of bit lines, a plurality of memory cells and a plurality of sense amplifiers are provided in said memory array region;

a main amplifier is included in said first region;

a bit line selection signal is formed by said address decoder; and a signal obtained from a selected bit line is amplified through said main amplifier.

* * * * *